March 4, 1958 H. M. ZEIDLER 2,825,810

SEMI-CONDUCTOR SIGNAL TRANSLATING CIRCUITS

Filed Feb. 1, 1955

INVENTOR.

Howard M. Zeidler

BY H. W. Newton

ATTORNEY

United States Patent Office 2,825,810

Patented Mar. 4, 1958

2,825,810

SEMI-CONDUCTOR SIGNAL TRANSLATING CIRCUITS

Howard M. Zeidler, Palo Alto, Calif., assignor to Radio Corporation of America, a corporation of Delaware Application February 1, 1955, Serial No. 485,516

3 Claims. (Cl. 250—36)

Figures 1, 2:
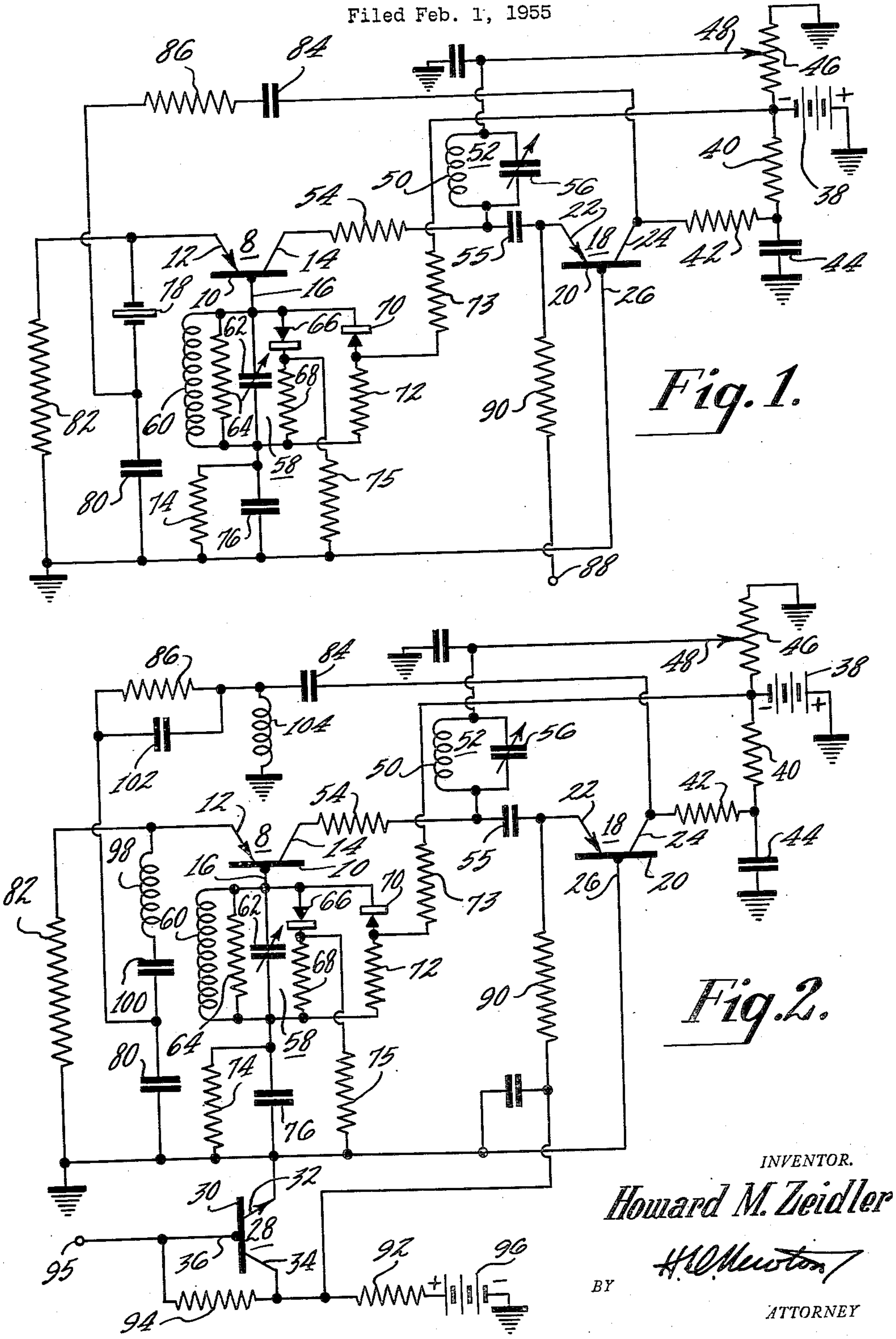

This invention relates in general to semi-conductor signal translating circuits, and in particular to means for controlling the frequency of oscillator circuits utilizing transistors.

It is often necessary in signal translating systems of different types to provide some means for controlling or otherwise modifying the frequency of the signal which is generated by an oscillator circuit. As an example, radio signal receiving systems are often provided with an automatic frequency control circuit which automatically tunes in the receiver to the precise frequency desired after it has been manually tuned to the approximate frequency of the desired signal.

Frequency control of an oscillator circuit may also be required for television signal receiving systems. As an example, in color television receiving systems a color subcarrier wave is synchronously demodulated. This is accomplished by a reference frequency oscillator operated in synchronism and in definite phase relation with the received phase and amplitude modulated color subcarrier wave. The oscillator signal, for proper operation of the receiver, is generally precisely controlled to be in phase with the color synchronous information, which is referred to as the "burst." Accordingly, the burst is compared with the output of the reference frequency oscillator. If a phase difference exists between the burst and the oscillator signal, a corrective voltage is developed which is applied to the oscillator circuit to correct for this phase difference. Thus, both radio and television signal receiving systems may utilize oscillator circuits in which the operating frequency is controlled in some manner.

Signal transmitting systems may also employ oscillator circuits, the frequency of which is controlled or modified. As an example, in order to convey signal intelligence from one point to another by means of carrier wave energy, the carrier wave may be frequency modulated at the transmitting point by signal intelligence. To this end, the operating frequency of an oscillator circuit may be frequency modulated by the application of a modulation signal.

One of the problems encountered in systems of these types is that it has often been found difficult to maintain the amplitude of the generated oscillations constant. In other cases the amplitude of the developed oscillatory signal may be too large. It is often necessary, moreover, to provide an oscillator circuit and frequency control means therefor in which relatively large frequency shifts are possible.

It is, accordingly, an object of the present invention to provide a stable and efficient frequency controlled oscillator circuit employing semi-conductor devices such as transistors.

It is another object of the present invention to provide a transistorized frequency controlled oscillator circuit wherein the amplitude of the controlled oscillator signal remains substantially constant.

It is yet another object of the present invention to provide a system for controlling or modifying the frequency of a transistorized oscillator circuit in which relatively large frequency shifts of the oscillator signal are obtainable.

These and further objects and advantages of the present invention are achieved, in general, by controlling the frequency of a transistor oscillator circuit, the base circuit of which contains a network for providing amplitude stabilization. Frequency control of the oscillator circuit is accomplished by a transistor modulator. The output current from the modulator is coupled to the oscillator and compared with the oscillator emitter current to provide a control voltage across a frequency control reactive element which is used to change the frequency of the developed oscillator signal. In this manner, effective frequency control and stable and efficient circuit operation are achieved.

The novel features that are considered characteristic of this invention are set forth with particularity in the appended claims. The invention itself, however, both as to its organization and method of operation, as well as additional objects and adavantages thereof, will best be understood from the following description when read in connection with the accompanying drawings, in which:

Figures 1 and 2 are schematic circuit diagrams of transistorized frequency controlled oscillator circuits embodying the present invention.

Referring now to the drawing, wherein like parts are indicated by like reference numerals in both figures, and referring particularly to Figure 1, a frequency controlled oscillator circuit includes a transistor 8, which is the active element of the oscillator circuit and a transistor 18 which serves as the frequency control or modulating element. Each transistor comprises a semiconductive body with which three electrodes are cooperatively associated in a well known manner. Thus, the transistor 8 comprises a semi-conductive body 10 and an emitter 12, a collector 14 and a base 16. In the same manner the transistor 18 comprises a semi-conductive body 20 and an emitter 22, a collector 24 and a base 26. The transistor 8 may be considered to be of the current multiplication or point-contact variety although transistors having characteristics similar to point-contact transistors may be utilized. The transistor 18, on the other hand, may be considered to be of the junction type although it should be understood that other types of transistors could be used with equal effectiveness. In both cases, the transistors have been illustrated as being of N type conductivity, the point-contact transistor being referred to as an N type and the junction transistor 18 being referred to as a P–N–P junction. Transistors of opposite conductivity types could be used, however, by reversing the polarity of the biasing voltage supply. Thus, the point-contact transistor 8 could be a P type point-contact transistor, while the junction transistor 18 could be of the N–P–N junction type.

To provide collector biasing potentials for both of the transistors, a battery 38 is provided, the positive terminal of which is connected to a point of fixed reference potential or ground for the system and the negative terminal of which is connected through a pair of serially connected resistors 40 and 42 to the collector 24 of the modulating transistor 18. To by-pass unwanted alternating current signals to ground, a capacitor 44 is connected from the junction of the resistors 40 and 42 to ground as shown. The negative terminal of the biasing battery 38 is also connected through the lower half of a potentiometer comprising a resistor 46 and a variable tap 48, an inductor 50 of a parallel resonant tuned output circuit 52 and a resistor 54 to the collector 14 of the oscillator transistor 8. The parallel resonant tuned circuit 52, which includes an inductor 50 and a variable capacitor 56, comprises a load circuit for the oscillator.

In accordance with one feature of the invention, an amplitude sensitive feedback network 58 is connected with the base 16 of the oscillator transistor 8. The feedback network 58 includes five parallel branches including an inductor 60 and a variable tuning capacitor 62 which comprise a parallel resonant tuned circuit, which is tuned to the desired frequency of the generated oscillator signal. The other parallel branches of the network 58 include a resistor 64 and two further branches each of which include a serially connected diode and a resistor. Thus, one of these latter parallel branches includes a diode 66 and a resistor 68, while the other of these branches includes a diode 70 and a resistor 72. The diodes 66 and 70, it will be noted, are poled in opposite directions. To provide reverse biasing voltages for the diodes 66 and 70, the junction of the diode 66 and the resistor 68 is connected to ground through a resistor 75, while the junction of the diode 70 and the resistor 72 is connected through a resistor 73 to the negative terminal of the battery 38.

A biasing resistor 74, which is connected in shunt with a by-pass capacitor 76, is connected between the network 58 and a point of reference potential or ground as shown. Frequency determining means such as a piezoelectric crystal 78 and, in accordance with another feature of the invention, a frequency control reactive element such as a capacitor 80 are serially connected between the emitter 12 of the oscillator transistor 8 and ground. While the frequency control reactive element has been illustrated as being a capacitor, and a capacitor is to generally be preferred, it could, it should be understood, be an inductor if desired. The oscillator circuit is completed by a resistor 82 which is connected in parallel with the crystal 78 and the capacitor 80 to ground.

In operation, since the transistor 8 is of the current multiplication or point-contact variety, a negative resistance is developed between the emitter 12 and ground. Accordingly, when a suitable frequency determining element or network such as the piezoelectric crystal 78 is connected with the emitter of the point-contact transistor 8, the circuit will oscillate due to the negative resistance which is supplied by the transistor 8. The parallel resonant or frequency determining circuit comprising the inductor 60 and the capacitor 62 in the base circuit of the oscillator transistor 8 is also tuned to the frequency of the oscillator signal.

If it is assumed that no signal current is flowing in the circuit, the diodes 66 and 70 will be maintained in the high resistance-low current state by the small reverse bias voltages which are developed across the resistors 68 and 72. Under static operating conditions, therefore, the feedback impedance of the base circuit of the transistor 8 is relatively high and the negative resistance which is developed between the emitter and ground will be correspondingly high. Thus, with a suitable frequency determining element or network connected to the emitter of the emitter oscillator transistor 8, oscillations will be developed in the circuit. If the amplitude of oscillatory current increases in the base circuit of the transistor 8, the diodes 66 and 70 will conduct through the resistors 68 and 72 in the forward or low impedance direction. Accordingly, the positive feedback impedance is decreased, and the emitter circuit negative resistance correspondingly decreases. In this manner an equilibrium condition is obtained between the emitter or input circuit negative resistance and the positive resistance of the crystal 78. In the foregoing manner, the amplitude of the oscillator signal which is generated is limited, and stabilized Class A operation is easily and effectively achieved.

The collector 14 of the oscillator transistor 8 is connected through a serially connected resistor 54 and a coupling capacitor 55 to the emitter 22 of the modulator transistor 18. By limiting the oscillator circuit as described above, overdriving of the modulator transistor 18 by the oscillator transistor 8 is not possible. Thus, complete saturation and adequate current gain of the modulator transistor 18 are permitted.

The collector 24 of the modulator transistor 18 is connected through a serially connected capacitor 84 and a resistor 86, in accordance with another feature of the invention, to the junction of the piezoelectric crystal 78 and the frequency control reactive element, which is illustrated as being the capacitor 80. In order to control the frequency of oscillation, the emitter 22 of the modulator transistor 18 is connected through a resistor 90 to an input terminal 88 to which may be applied a suitable direct current control current.

In operation, the collector alternating current of the modulator transistor 18 is controlled by adjusting the emitter biasing current of this transistor. This is achieved by varying the direct current which is applied to the terminal 88. The frequency modulator transistor 18 is then used as a control element between the collector circuit of the oscillator transistor 8 and the frequency control capacitor 80 in the emitter circuit of the oscillator transistor 8. The phase conditions in the circuit are such that the emitter current of the oscillator transistor 8 and the output or collector current of the transistor 18 are in phase opposition through the capacitor 80. When the frequency control direct current which is applied at the terminal 88 is adjusted such that the emitter alternating current of the transistor 8 is equal to the output alternating current of the transistor 18, zero voltage will appear across the capacitor 80. Accordingly, the frequency of oscillation will not be changed. The frequency of oscillation will then be the frequency of the basic oscillator circuit.

If, however, the collector current of the modulator transistor 18 is made smaller than the emitter current of the oscillator transistor 8, the voltage across the capacitor 80 will correspond to a capacitive voltage. Accordingly, the frequency of oscillation will be increased. Conversely, if the collector current of the modulator transistor 18 is made larger than the emitter current of the oscillator transistor 8, the voltage across the capacitor 80 will be reversed. In this case, the frequency deviation of the oscillator circuit will be that which will be introduced by a series inductor. Accordingly, the frequency of the oscillator signal will be decreased.

Thus, by provision of the present invention, both positive and negative frequency increments are easily obtainable. Moreover, relatively small changes in the control current which is applied to the terminal 88 will be effective to change the frequency of oscillation. In addition, the amount of frequency shift which is obtainable is relatively large.

In Figure 2, another embodiment of the invention includes the oscillator transistor 8 and the modulator transistor 18 and, in addition, a further transistor 28 which provides direct current amplification and is used to control the emitter current of the modulator transistor 18. The transistor 28 may be considered to be of the N–P–N junction type although other types of transistors could be used. The transistor 28 comprises a semi-conductive body 30 and three electrodes which are cooperatively associated with the body 30 in a well known manner and which are referred to as an emitter 32, a collector 34 and a base 36. The emitter 32 of the transistor 28 is connected directly with ground, and a feedback resistor 94 is connected between the collector 34 and the base 36 for stabilization purposes. Collector biasing potential for the transistor 28 is obtainable by a battery 96, the negative terminal of which is grounded and the positive terminal of which is connected through a resistor 92 to the collector 34. The battery 96 also provides emitter biasing voltage for the modulator transistor 18.

A frequency control input current may be applied to the input terminal 95 which is connected directly with the base 36 of the transistor 28. The direct current amplifier transistor 28 amplifies this frequency control current, and its collector current is used to vary the emitter current of the modulator transistor 18 in the same manner as discussed above. Control of the emitter current of the modulator transistor 18 will control its output or collector current, which will in turn control the frequency of the oscillator circuit.

In other aspects, the circuit illustrated in Figure 2 is substantially identical to the one illustrated in Figure 1 and is operative in substantially the same manner and with the same advantages. One difference is that the frequency determining means for the oscillator circuit comprises a serially connected inductor 98 and a capacitor 100 which are operated at series resonance and are used in this embodiment of the invention rather than the crystal. In addition, an inductor 104 which is connected from the junction of the capacitor 84 and the resistor 86 to ground in the modulator transistor's collector output lead and a capacitor 102 which is connected across the resistor 86 may be used to compensate for any undesired phase shifts which may be developed by the transistors 8 or 18 at high frequency operation.

As described, frequency control or modulation of an oscillator is effectively accomplished with circuits characterized by their stable and efficient operation. The circuits disclosed can be used for modulating an oscillator signal or for correcting the frequency of the oscillator signal. Relatively large frequency shifts are obtainable and the amplitude of the oscillator signal which is controlled or frequency modulated remains substantially constant. In addition, the circuits are sensitive to relatively small changes of the control current and may find wide application where reliable frequency control or modulation of an oscillator signal is desired or required.

What is claimed is:

1. In a frequency controlled oscillator circuit including a point of fixed potential therein, the combination with a first semi-conductor device having a first base, a first emitter and a first collector electrode, said first semi-conductor device being of the current multiplication type, and a second semi-conductor device having a second base, a second emitter and a second collector electrode, of frequency determining means for said oscillator circuit and a frequency control reactive element serially connected between said first emitter electrode and said point of fixed potential, a feedback network connected in series between said first base electrode and said point of fixed potential and including a first and a second diode, said first diode being poled in a direction opposite to that of normal base current flow of said first semi-conductor device and said second diode being poled in the same direction as that of normal base current flow of said first semi-conductor device whereby said feedback network is sensitive to changes in the amplitude of the oscillatory signal and provides stable class A operation of said oscillator circuit, conductive circuit means connecting said second collector electrode to the junction of said frequency determining means and said reactive element, and means providing a source of frequency control input current connected with said second emitter electrode.

2. In a frequency controlled oscillator circuit including a point of fixed potential therein, the combination with a first semi-conductor device having a first base, a first emitter and a first collector electrode, said first semi-conductor device being of the current multiplication type; and a second semi-conductor device having a second base, a second emitter and a second collector electrode; of frequency determining means for said oscillator circuit and a frequency control reactive element serially connected between said first emitter electrode and said point of fixed potential; an amplitude sensitive feedback network connected in series between said first base electrode and said point of fixed potential; said feedback network comprising an inductor, a resistor, a variable capacitor, a serially connected first diode and first resistor, and a serially connected second diode and second resistor connected in parallel, said first and second diodes being poled in opposite directions; means including a source of potential providing collector biasing voltages for said first and second semi-conductor devices; conductive circuit means connecting said source of potential with the junction of said second diode and said second resistor; and conductive circuit means connecting said second collector electrode with the junction of said frequency determining means and said reactive element.

3. A transistor oscillator circuit comprising, in combination, a transistor including base, emitter, and collector electrodes, positive voltage feedback means connected with the base electrode of said transistor to sustain oscillations of said circuit, amplitude stabilization means for said circuit including a first and second diode connected with said base electrode and in parallel with each other and poled in opposite directions relative to base current flow of said transistor, and means connected with said diodes for applying reverse bias thereto under static operating conditions to provide a relatively high base circuit impedance, said diodes being forward biased in response to a developed oscillator signal to reduce the base circuit impedance and limit the amplitude of the developed oscillator signal.

References Cited in the file of this patent

UNITED STATES PATENTS

| | | |
|---|---|---|
| 2,426,295 | Born | Aug. 26, 1947 |
| 2,438,392 | Gerber | Mar. 23, 1948 |
| 2,570,436 | Eberhard et al. | Oct. 9, 1951 |
| 2,570,938 | Goodrich | Oct. 9, 1951 |
| 2,705,287 | Wu-Nien Lo | Mar. 29, 1955 |
| 2,728,049 | Riddle | Dec. 20, 1955 |